United States Patent
Brisebois

(10) Patent No.: US 9,270,133 B2
(45) Date of Patent: Feb. 23, 2016

(54) MONITORING CELLS IN ENERGY STORAGE SYSTEM

(75) Inventor: Glen James Brisebois, San Jose, CA (US)

(73) Assignee: LINEAR TECHNOLOGY CORPORATION, Milpitas, CA (US)

(*) Notice: Subject to any disclaimer, the term of this patent is extended or adjusted under 35 U.S.C. 154(b) by 1992 days.

(21) Appl. No.: 11/896,669

(22) Filed: Sep. 5, 2007

(65) Prior Publication Data

US 2010/0327806 A1   Dec. 30, 2010

Related U.S. Application Data

(60) Provisional application No. 60/907,423, filed on Apr. 2, 2007.

(51) Int. Cl.
```
H02J 7/00      (2006.01)
B60L 11/18     (2006.01)
H01M 2/20      (2006.01)
H01M 10/48     (2006.01)
G01R 31/36     (2006.01)
```

(52) U.S. Cl.
CPC .......... *H02J 7/007* (2013.01); *B60L 11/1853* (2013.01); *B60L 11/1864* (2013.01); *G01R 31/3658* (2013.01); *H01M 2/206* (2013.01); *H01M 10/482* (2013.01); *H02J 7/0021* (2013.01); *B60L 2240/545* (2013.01); *B60L 2240/547* (2013.01); *B60L 2240/549* (2013.01); *G01R 31/3606* (2013.01); *G01R 31/3648* (2013.01); *Y02T 10/7055* (2013.01)

(58) Field of Classification Search
USPC ................. 320/116, 122, 134, 136, 144, 150
See application file for complete search history.

(56) References Cited

U.S. PATENT DOCUMENTS

| | | | |
|---|---|---|---|
| 5,652,498 A | 7/1997 | Edye et al. | |
| 6,014,013 A * | 1/2000 | Suppanz et al. | ............. 320/122 |
| 6,133,709 A | 10/2000 | Puchianu | |
| 6,404,166 B1 | 6/2002 | Puchianu | |
| 6,411,912 B1 | 6/2002 | Sack | |

(Continued)

FOREIGN PATENT DOCUMENTS

| | | |
|---|---|---|
| CN | 1319189 A | 10/2001 |
| EP | 1037065 A1 | 9/2000 |

(Continued)

OTHER PUBLICATIONS

International Search Report and the Written Opinion of the International Searching Authority issued in International Patent Application No. PCT/US2007/023133 dated Sep. 23, 2009.

(Continued)

*Primary Examiner* — Robert Grant
(74) *Attorney, Agent, or Firm* — McDermott Will & Emery LLP

(57) ABSTRACT

A system for monitoring an energy storage system composed of multiple cells connected in series has a chain of monitors including at least first and second monitors. The first monitor is configured for monitoring at least a first cell in the energy storage system to produce first monitored data. The second monitor is configured for monitoring at least a second cell in the energy storage system to produce second monitored data. The first monitor is further configured for transferring the first monitored data to the second monitor for delivery to a controller.

16 Claims, 4 Drawing Sheets

(56) References Cited

U.S. PATENT DOCUMENTS

| | | | |
|---|---|---|---|
| 7,388,351 | B2 | 6/2008 | Yudahira |
| 2003/0044689 | A1 | 3/2003 | Miyazaki et al. |
| 2005/0024015 | A1 | 2/2005 | Houldsworth et al. |
| 2005/0162129 | A1 | 7/2005 | Mutabdzija et al. |
| 2005/0242775 | A1* | 11/2005 | Miyazaki et al. ............ 320/116 |
| 2006/0087287 | A1 | 4/2006 | Thrap |
| 2006/0097700 | A1 | 5/2006 | Studyvin et al. |
| 2008/0018305 | A1 | 1/2008 | Altemose |
| 2008/0077339 | A1 | 3/2008 | Seo et al. |
| 2008/0086247 | A1 | 4/2008 | Gu et al. |
| 2008/0090133 | A1 | 4/2008 | Lim et al. |
| 2008/0091362 | A1 | 4/2008 | Tae et al. |
| 2008/0091363 | A1 | 4/2008 | Lim et al. |
| 2008/0091364 | A1 | 4/2008 | Lim et al. |

FOREIGN PATENT DOCUMENTS

| | | | |
|---|---|---|---|
| EP | 1 067 393 | A | 1/2001 |
| EP | 1 067 393 | A2 | 1/2001 |
| EP | 1289096 | A2 | 3/2003 |
| JP | 08-019188 | | 1/1996 |
| JP | 2002-521792 | A | 7/2002 |
| JP | 2003-070179 | A | 3/2003 |
| JP | 2003-070179 | A | 3/2003 |
| JP | 2005-517376 | A | 6/2005 |
| JP | 2007-048746 | A | 2/2007 |
| TW | 200533032 | A | 10/2005 |
| WO | 8607502 | A1 | 12/1986 |
| WO | WO-98/32181 | A3 | 11/1998 |
| WO | 00/05596 | A1 | 2/2000 |
| WO | 03-067733 | A1 | 8/2003 |

OTHER PUBLICATIONS

Japanese Office Action with English translation issued in Japanese Application No. 2010-502066 mailed on Sep. 13, 2012.

Chinese Office Action issued in Chinese Application No. 200780052791.0 dated May 12, 2014, w/English translation.

Official Letter dated Nov. 15, 2013 for Taiwan Patent Application No. 96143532.

European Examination Report, issued in European Patent Application No. 07 875 257.3, dated Mar. 23, 2010.

Japanese Office Action issued in Japanese Application No. 2014-057613, dated Jan. 21, 2015, with English translation.

Japanese Office Action issued in Application No. 2010-502066 dated Jan. 24, 2014.

Japanese Office Action cited in Application No. 2010-502066 dated Jun. 21, 2013.

Kudo, A., et al., "Cell Controller for Lithium Ion Battery Using ASIC", 2006, pp. 16-20, No. 16, Shin-Kobe Electric Machinery Co., Ltd.

Thoren, Mark, "16-Bit ADC Simplifies Current Measurements", Design Note 341, Linear Technology Design Notes, 2004, Linear Technology Corporation, Milpitas, CA.

"Dual Precision Instrumentation Switched Capacitor Building Block", LTC 1043, Linear Technology, pp. 1-16, Linear Technology Corporation, Milpitas, CA.

"±250V Input Range G=1, 10, Micropower, Difference Amplifier", Linear Technology, pp. 1-16, Linear Technology Corporation, Milpitas, CA.

* cited by examiner

BACKGROUND

MONITORING CELLS IN ENERGY STORAGE SYSTEM

This application claims priority of provisional U.S. patent application No. 60/907,423 filed on Apr. 2, 2007, entitled "VOLTAGE STACKABLE DATA PORT" and incorporated herewith by reference.

TECHNICAL FIELD

The subject matter of this disclosure relates to power supply circuits, and, more particularly, to circuitry and methodology for monitoring series-connected energy storage cells.

BACKGROUND

Management of an energy storage system, such as an electric battery or an ultracapacitor or supercapacitor energy storage system, is essential to ensuring long life, efficiency, and reliability of the energy storage system and an equipment powered by the energy storage system. Proper management requires real time knowledge of cell voltage, i.e. voltage at each energy storage cell should be permanently monitored. Energy storage systems include multiple energy storage cells connected in series, i.e. "stacked", so that individual cells near the top of the stack may be at elevated voltages with respect to the system ground.

FIG. 1 illustrates a battery 10 representing an example of an energy storage system. The battery 10 is composed of multiple cells connected in series. While a cell arranged closer to the ground terminal is at a low potential, another cell connected at the other side of the battery stack may be at a high potential. For example, eighty-one 4.2V cells shown in FIG. 1 would cause a total voltage of approximately 340V. Therefore, voltage measuring devices capable of measuring voltages of individual cells must withstand very high voltages. Using such high voltage measuring devices for stacked battery management would be extremely expensive and prone to errors.

Another example of an energy storage system is an ultracapacitor or supercapacitor system. Ultracapacitors or supercapacitors represent one of the latest innovations in the field of electrical energy storage, and find their place in many applications involving mass energy storage, power distribution. They are of particular interest in automotive applications for hybrid vehicles and as supplementary storage for battery electric vehicles. In comparison with classical capacitors, these new components allow a much higher energy density, together with a higher power density. Ultracapacitors or supercapacitors may be produced based on a double-layer capacitor technology to increase their charge density. However, double layer capacitors have a relatively low maximum voltage. This necessitates a series connection of cells to support operation at higher voltages in order to reach an acceptable power conversion efficiency.

The higher the cell voltage, the shorter the expected life of a double layer capacitor. Therefore, cell voltages in the ultaracapacitor or supercapacitor system should be monitored to prevent voltages at individual cells from exceeding maximum values. Also, ultracapacitors or supercapacitors must be monitored during charging to prevent the charging voltage from exceeding the rated voltage.

A common method of measuring voltages at high common modes involves a 4-resistor difference amplifier having a resistor network arranged as a common-mode voltage divider. For example, this arrangement is used in the LT®1990 difference amplifier developed by the Linear Technology Corporation, the assignee of the present application. However, matching resistors in the resistor network is a difficult problem. Mismatched resistors may compromise measurement accuracy as the common mode voltage increases. Also, the resistor dividers represent a load on the battery.

Another known method of measuring voltage involves capacitive switching. This method is used for measuring a low voltage, for example, in the LTC®1043 dual switched capacitor building block developed by the Linear Technology Corporation, the assignee of the present application. In this block, a pair of switches alternately connects an external capacitor to an input voltage and then connects the charged capacitor across an output port. However, at high common mode voltages, this method would require high voltage MOSFETs, which are not readily available in monolithic chips.

A further known method includes direct digitization, and level shifting of digital information. This type of measurement is described in Linear Technology Design Note DN341 by Mark Thoren entitled "16-bit ADC Simplifies Current Measurements," although the Design Note relates to measurement of current rather than voltage. The Design Note describes a −48V telecom supply current monitor using 16-bit Delta-Sigma analog/digital converter (ADC) for direct current (DC) measurements. The monitor uses optoisolators as level shifting devices for data transfer. However, this method is appropriate for a small number of measurements. Measuring voltage at a large number of cells would require many optoisolators (or transistors) and become cumbersome.

Therefore, it would be desirable to create a simple and efficient technique for monitoring voltages at multiple energy storage cells connected in series.

SUMMARY OF THE DISCLOSURE

The present disclosure offers circuitry and methodology for monitoring individual cells in an energy storage system composed of multiple cells connected in series. The system includes a chain of monitors having at least first and second monitors. The first monitor monitors at least a first cell in the energy storage system to produce first monitored data. The second monitor monitors at least a second cell in the energy storage system to produce second monitored data. The first monitor is configured for transferring the first monitored data to the second monitor.

In particular, the first monitor may be configured for monitoring a first group of the cells including the first cell, and the second monitor may monitor a second group of the cells including the second cell.

The first monitored data may represent at least one parameter of each cell in the first group of cells, and the second monitored data may represent at least one parameter of each cell in the second group of cells. For example, the monitored data may represent voltage at each cell, and temperature affecting the cell.

The first and second monitors may be adjacent monitors in the chain that further comprises a third monitor adjacent the second monitor and configured for monitoring at least a third cell in the energy storage system to produce third monitored data. The third cell monitor may be further configured for receiving the first monitored data from the first monitor via the second monitor and for receiving the second monitored data from the second monitor.

In accordance with an embodiment of the disclosure, a monitor may transfer monitored data to a controller via an adjacent monitor. The controller may produce control data transferred to the monitor via the adjacent monitor.

The control data may be produced in response to the monitored data. For example, the control data may prevent an individual cell in an energy storage system from being overcharged when the energy storage system is being charged. In response to the monitored data relating to a particular cell, the monitor may create a shunt that forces a charging current to bypass that cell. The monitor may have a switch controlled by the control data to produce the shunt.

In accordance with a method of the present disclosure, a first group of cells may be monitored by a first monitor to produce first monitored data, a second group of cells may be monitored by a second monitor to produce second monitored data. The first monitored data may be transferred to the second monitor for delivery to a controller.

In the opposite direction, control data may be transferred from the controller to the first monitor via the second monitor. The control data may be transferred in response to the first monitored data to control a condition of a cell in the first group of the cell.

Additional advantages and aspects of the disclosure will become readily apparent to those skilled in the art from the following detailed description, wherein embodiments of the present disclosure are shown and described, simply by way of illustration of the best mode contemplated for practicing the present disclosure. As will be described, the disclosure is capable of other and different embodiments, and its several details are susceptible of modification in various obvious respects, all without departing from the spirit of the disclosure. Accordingly, the drawings and description are to be regarded as illustrative in nature, and not as limitative.

BRIEF DESCRIPTION OF THE DRAWINGS

The following detailed description of the embodiments of the present disclosure can best be understood when read in conjunction with the following drawings, in which the features are not necessarily drawn to scale but rather are drawn as to best illustrate the pertinent features, wherein.

DETAILED DISCLOSURE OF THE EMBODIMENTS

The present disclosure will be made using specific examples of monitoring circuits. It will become apparent, however, that the concept of the disclosure is applicable to any circuitry for monitoring any energy storage system having multiple cells.

Figure 1:
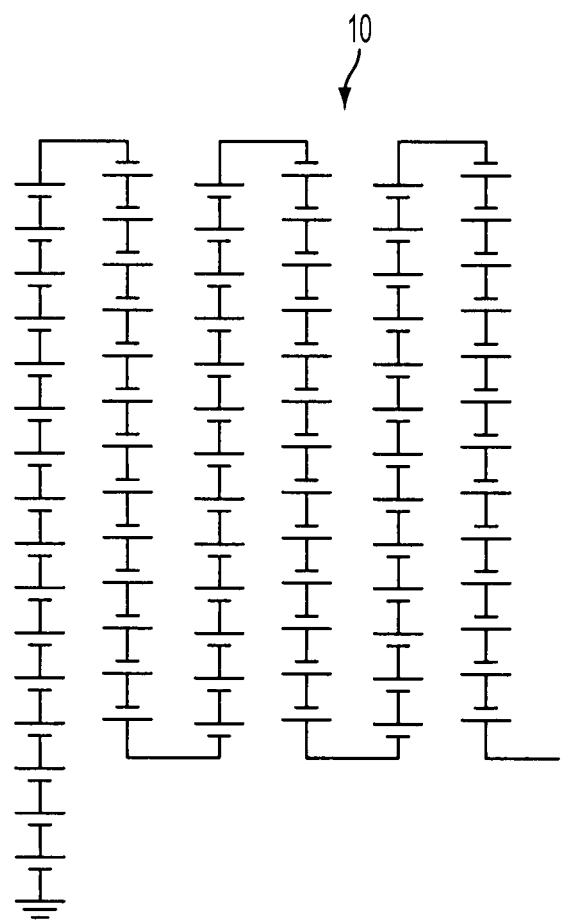
FIG. 1 illustrates a battery composed of multiple cells connected in series.
Figure 2:
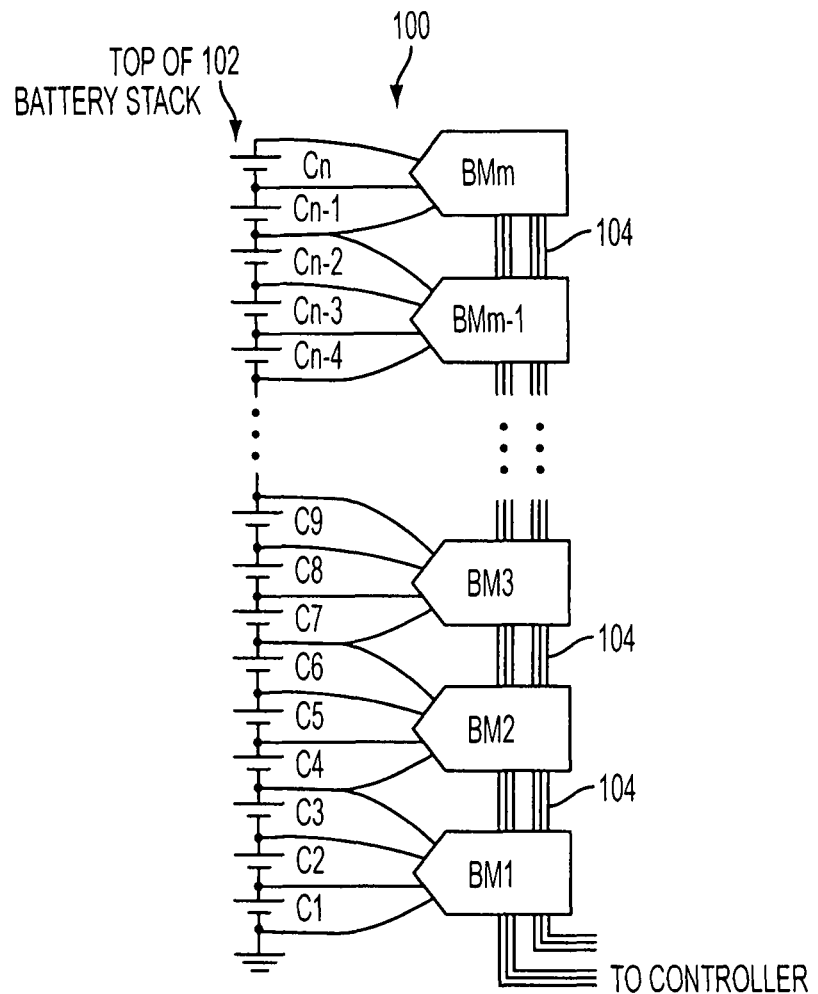
FIG. 2 illustrates an exemplary monitoring system of the present disclosure for monitoring an energy storage system composed of multiple cells connected in series.

FIG. 2 shows an exemplary monitoring system 100 of the present disclosure for monitoring an energy storage system 102 composed of n cells C1 to Cn connected in series between terminals of the energy storage system 102. In the illustrated example, cells C1 to Cn may be Lithium-Ion (Li-Ion) batteries commonly used in such applications as consumer electronics and hybrid electric vehicles. However, as one skilled in the art would realize, cells C1 to Cn may be any energy storage elements. For example, they may be ultracapacitor or supercapacitor cells. The cell C1 may be connected to a ground terminal, whereas the cell Cn may be connected to a high voltage terminal of the energy storage system 102, for example, to a +350V terminal.

The monitoring system 100 includes a chain of m battery monitoring units BM1 to BMm, each of which may be configured for monitoring a predetermined number of cells C. The number of cells C monitored by each unit BM may range from 1 to 16 or higher. This number may be determined by the ability of the monitoring units BM to withstand voltage. For example, the withstand capability of each unit BM may be about 60V. Also, the number of monitored cells C may be limited by a pin count of a semiconductor chip on which a particular unit BM is provided. For example, FIG. 2 shows that the monitoring unit BM1 monitors 3 cells C1 to C3, the unit BM2 monitors 3 cells C4 to C6, etc., finally, the monitoring unit BMm monitors 2 cells Cn−1 and Cn. The monitoring units BM may monitor conditions of cells C by determining such parameters, as voltage at each cell C, or temperature affecting the cells C.

Each monitoring unit BM may be powered using a cell pack monitored by the respective unit BM. Alternatively, a monitoring unit BM may have a power supply source independent of the monitored cells C.

Adjacent monitoring units BM may monitor adjacent groups of the cells C. For example, the monitoring unit BM1 may monitor cells C1 to C3, and the unit BM2 adjacent BM1 may monitor cells C4 to C6. Alternatively, adjacent units BM may monitor any predetermined groups of cells C.

Each pair of adjacent units BM is connected by a communication link 104 that provides a path for data transfers between the units. As shown in FIG. 2, the communication links 104 may be arranged between the unit BM1 and unit BM2, between the unit BM2 and the unit BM3, between the unit BM3 and the next monitoring unit, finally, between the unit BMm−1 and the unit BMm. Each of the communication links 104 may be configured for providing serial and/or parallel transfer of data between the adjacent units BM. Although FIG. 2 shows that each communication link 104 is composed of 6 lines, one skilled in the art would realize that the communication link 104 may include any number of lines required to support data transfer in accordance with a selected serial and/or parallel data transfer protocol. For example, as discussed in more detail below, the communication links 104 may support a data transfer protocol corresponding to an interface, such as a Serial Peripheral Interface (SPI), established between the monitoring unit BM1 and an external controller that may be linked to the unit BM1 to receive monitored data from the monitoring units BM1 to BMm and/or supply them with control data. Alternatively, the external controller may be coupled to any other monitoring unit BM.

Each communication link 104 may support bi-directional transfer of monitored and controlled data between the adjacent units BM in a serial and/or parallel fashion. For example, monitored data produced by a monitoring unit BMk may be transferred "down" from the unit BMk to a monitoring unit BMk−1 adjacent to the unit BMk in the chain of monitoring units, where the unit BMk may be any monitoring unit provided between BM1 and BMm for monitoring cells C arranged farther from the ground terminal than the cells C monitored by the unit BMk−1, and closer to the ground terminal that the cells C monitored by the unit BMk+1. If the unit BMk−1 is not connected to the controller, it will transfer the monitored data over the next communication link 104 to a unit BMk−2, etc. Control data may be transferred in the opposite direction from the unit BMk−1 to the unit BMk, and then, from the unit BMk to the unit BMk+1. For example, control data may be transferred in a parallel format, whereas monitored data may be shifted in a serial format. Alternatively, both the monitored and control data may be transferred in a similar fashion—in a parallel or serial format.

The monitored data may include one or more parameters of a cell or a group of cells being monitored by the respective monitoring unit BM, such as cell voltage and temperature. The control data may include address information identifying a particular cell or a group of cells, and/or control information indicating an operation to be performed in connection with a particular cell or a group of cells.

For example, the monitoring system 100 may monitor charging of the energy storage system 102. As individual cells C of the energy storage system 102 may become fully charged at different moments of time, the monitoring system 100 may be controlled to stop or slow charging of a particular cell when it reaches a predetermined voltage to prevent it from being damaged. In particular, during a charging procedure, the monitoring units BM may monitor voltage at each cell C and temperature affecting the cell C. Over communication links 104, the monitored data determined by a unit BMk may be transferred to an adjacent unit BMk−1, then from the unit BMk−1 to the next unit BMk−2, until the transferred data reach the unit BM1 coupled to a controller. From the unit BM1 the monitored data are transmitted to the controller that may determine that a particular cell Ci reaches a predetermined voltage at a particular temperature. Based on this information, the controller may produce control data identifying the cell Ci and instructing the monitoring system 100 to prevent the cell Ci from being further charged. The control data are transmitted to the unit BM1 connected to the controller. From the unit BM1 the control data are transferred over communication links 104 to the next unit BM2, then from the unit BM2 to the next BM unit, until the control data reaches the unit BMk that monitors the cell Ci. The control data may cause the unit BMk to take appropriate actions in order to prevent the cell Ci from being further charged. For example, as described in more detail later, a respective switch in the unit BMk may be controlled to create a charge current shunt around the cell Ci so as to force the charge current to bypass the cell Ci.

Figure 3:
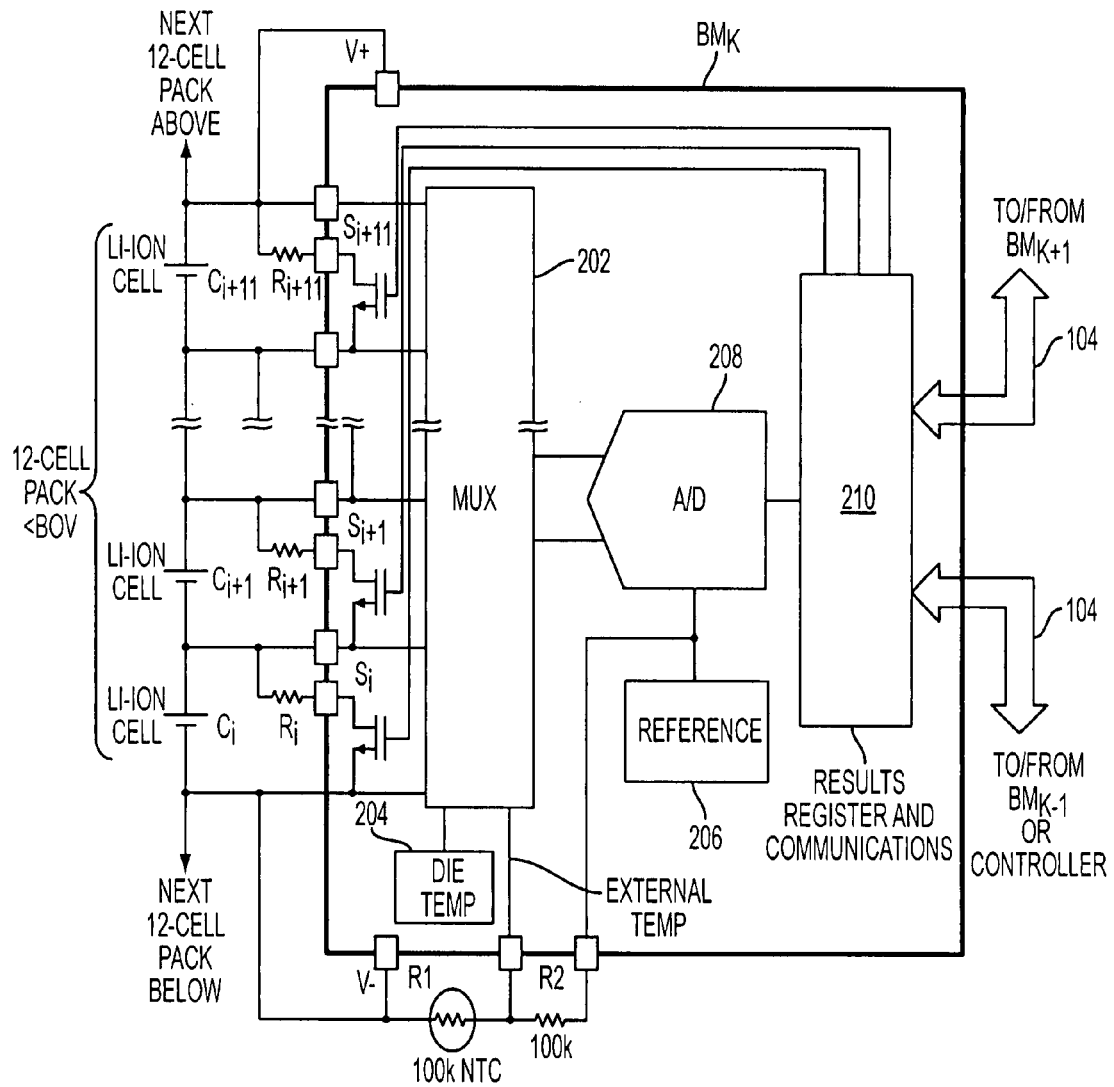
FIG. 3 shows an exemplary implementation of a monitoring unit in the system of the present disclosure.

FIG. 3 illustrates an exemplary arrangement of a monitoring unit BMk in the monitoring system 100. The monitoring unit BMk may be arranged between units BMk+1 and BMk−1 in a chain of monitoring units BM to monitor a 12-cell pack of the energy storage system 102 composed of 12 cells Ci, Ci+1, . . . , Ci+11. To comply with the voltage withstand capability of the unit BMk, the 12-cell pack Ci to Ci+11 may be selected so as provide a total voltage less than 60V between terminals V+ and V− of the cell pack. The monitoring unit BMk may be implemented on a chip powered by the voltage provided by the cell pack.

The monitoring unit BMk may include a multiplexer 202 having multiple parallel inputs connected across each of the cells Ci to Ci+11 to determine voltages at the respective cells Ci to Ci+11. The output of the multiplexer 202 may present multiple input cell voltages as a single sequence of cell voltages.

Switches Si to Si+11 may be respectively connected to cells Ci to Ci+11 to control their conditions. In particular, the switches Si to Si+11 may be controlled to shunt the respective cells. For example, during charging of the energy storage system 102, any of the switches S may be switched into an ON state to provide a bypass for the charge current around the respective cell C. As a result, the respective cell C may be prevented from being overcharged. For example, field-effect transistors may be used as the switches Si to Si+11. Power resistors Ri to Ri+11 may be connected to the respective switches Si to Si+11 to limit current and control power dissipation. For example, the resistors Ri to Ri+11 may have values around 10-100Ω.

Also, the multiplexer 202 may be connected to a die temperature sensor 204 that provides the multiplexer with an input signal indicating the internal temperature of the chip, on which the unit BMk is formed. Further, the unit BMk may utilize a resistor divider R1, R2 connected to the chip for determining the temperature external with respect to the chip. The resistor divider may include a temperature sensor resistor R1, such as a resistor with a Negative Temperature Coefficient (NTC), and a resistor R2 connected to a reference voltage source 206 that provides a reference voltage such as 1.2V. The resistor divider R1, R2 provides the multiplexer 202 with an input signal indicating the external temperature.

The internal and external chip temperature information may be presented at the output of the multiplexer 202, together with a voltage sequence representing voltages at the cells Ci to Ci+11. An analog-to-digital (A/D) converter 208 may convert the analog output signal of the multiplexer 202 into a digital form. The reference voltage source 206 may provide a reference voltage required to perform analog to digital conversion. Hence, the digital output signal of the A/D converter 208 represents data monitored by the monitoring unit BMk including information on voltage at each of the cells Ci to Ci+11 and information on the internal and external chip temperature affecting the cells Ci to Ci+11.

The monitored data are supplied to a results register and communication circuit 210 that may perform level shifting and provide transferring of the monitored data over the communication link 104 to the unit BMk−1 that may monitor the next cell pack composed of the cells Ci−1 to Ci−12 connected closer to the ground terminal than the cells Ci to Ci+11 monitored by the unit BMk. Alternatively, if the circuit 210 is arranged in the "bottom" monitoring unit BM1 connected to the controller, the circuit 210 transfers the monitored data to the controller.

Further, the circuit 210 may be connected by another communication link 104 to the unit BMk+1 that may monitor the cell pack composed of the cells Ci+12 to Ci+24 connected farther from the ground terminal that the cells Ci to Ci+11. Over this communication link, the circuit 210 of the unit BMk receives data monitored by the units BMk+1 to BMm, and transfers the monitored data to the unit BMk−1. For example, the circuit 210 may contain a hardwired connection to transfer the data received from the unit BMk+1 to the unit BMk−1.

In addition, the circuit 210 of the unit BMk may be configured for receiving data from the unit BMk−1 over the communication link 104. For example, control data may be transferred from the unit BMk−1 to the unit BMk. If the control data relate to any of the cells Ci to Ci+11 monitored by the unit BMk, the circuit 210 may produce a signal to execute operation instructed by the control data. For example, the control data received from the unit BMk−1 may request preventing one or more of the cells Ci to Ci+11 from being charged. In this case, the circuit 210 may produce a control signal supplied to the gate of the respective switch Si to Si+11 in order to place the switch in an ON state so as to create a charge current shunt around the corresponding cell. If the data from the unit BMk−1 do not relate to the cells Ci to Ci+11, the circuit 210 of the unit BMk transfers the received data to the unit BMk+1.

Figure 4:
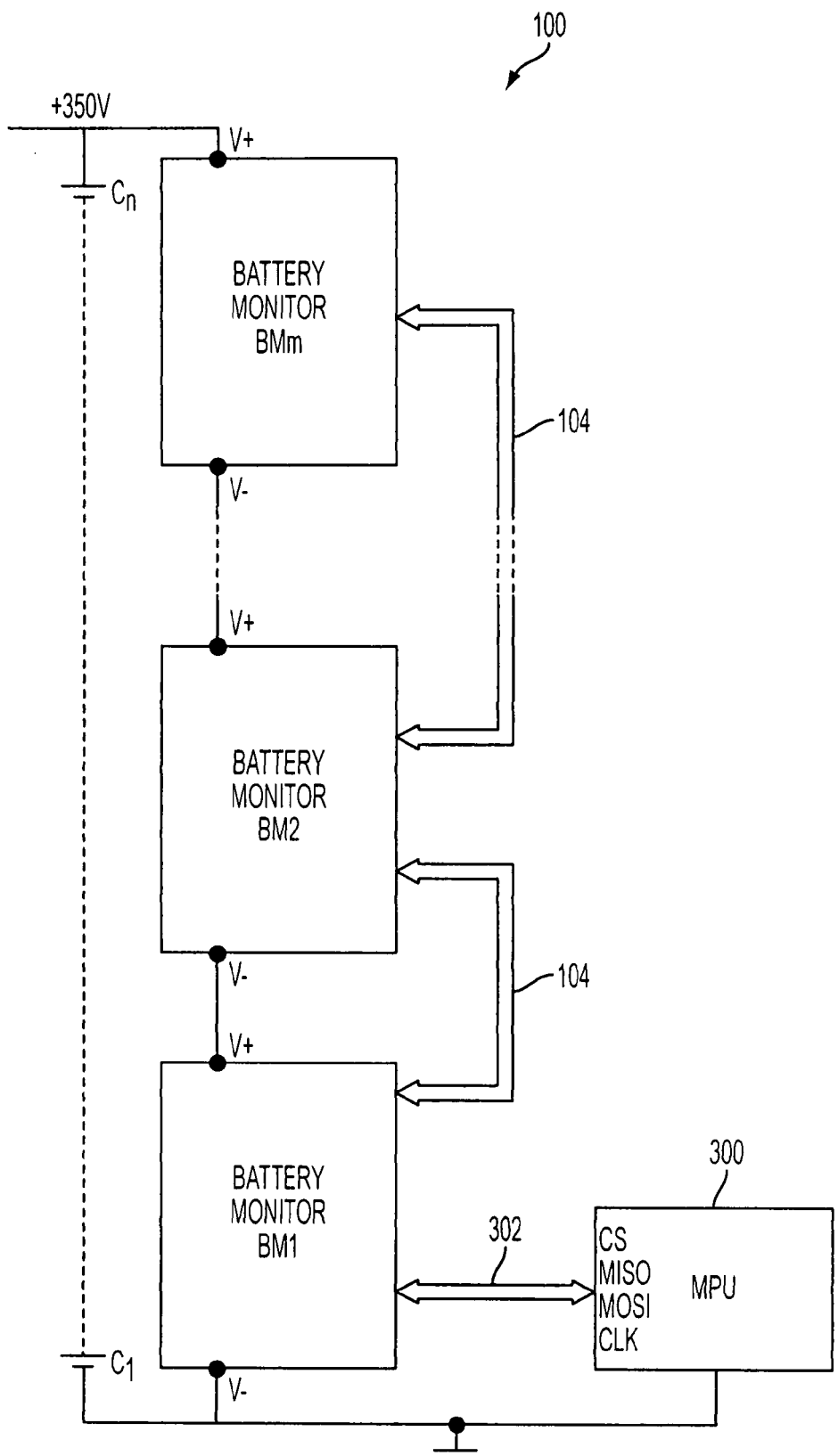
FIG. 4 illustrates an exemplary arrangement including a controller and multiple monitoring units connected in a daisy chain.

FIG. 4 schematically illustrates an exemplary connection between the units BM1 to BMm, each of which may have an arrangement similar to the arrangement of the unit BMk shown in FIG. 3. In particular, the units BM1 to BMm may be connected in a daisy chain, in which the unit BM1 is coupled to the unit BM2, the unit BM2 is coupled to the next BM unit in the chain, etc. The V+ terminal of one BM unit may be connected to the V− terminal of the adjacent BM unit. The V− terminal of the unit BM1 may be connected to the ground terminal of the energy storage system 102. The V+ terminal of the unit BMm may be connected to a high voltage terminal of the energy storage system 102, such as a +350V terminal. The cell packs connected between the V+ and V− terminals may provide power supply to the respective units BM.

A microprocessor unit (MPU) 300 may be connected to the unit BM1 to receive data monitored by the units BM1 to BMm and supply these monitoring units with control data. The MPU 300 may be powered from a power supply line independent from the energy storage system 102. Alternatively, the MPU 300 may be powered from the same cell pack as the unit BM1. For example, the monitoring system 100 of the present disclosure may be arranged in an electric vehicle to monitor an electrical battery of the vehicle. In this case, the MPU 300 may interact with a central controller of the vehicle. The MPU 300 may process voltage and temperature information indicating conditions of each cell in the battery.

Based on this information, the MPU 300 may, for example, control the monitoring system 100 to prevent individual cells from being overcharged when the energy storage system 102 is being charged. In particular, each cell can be safely charged until a predetermined cell voltage is reached at particular temperature conditions. After exceeding this voltage, the cell may be damaged. To prevent damages to the cells, the MPU 300 may process the voltage and temperature information monitored by the monitoring units BM1 to BMm to determine conditions of individual cells C when the energy storage system 102 is being charged. When data monitored by a unit BMk indicate that the voltage at a cell Ci reaches a predetermined level at particular temperature conditions, the MPU 300 produces control data with address information identifying the cell Ci and the unit BMk that monitors the cell Ci. Via monitoring units BM preceding the unit BMk in the daisy chain, the control data are transferred to the unit BMk to cause a gate control signal that switches in an ON state the switch Si corresponding to the cell Ci. As a result, a charge current shunt is created around the cell Ci to prevent it from being charged.

The BM1 may be connected to the MPU 300 via an interface 302. For example, a Serial Peripheral Interface (SPI) developed by Motorola may be used for connecting the MPU 300 to the monitoring units BM. The SPI provides a synchronous serial data transfer in a full duplex mode. The SPI uses a master-slave model, where a master device interacts with multiple slave devices. For example, the MPU 300 may act as a SPI master device, and multiple monitoring units BM1 to BMm may act as SPI slave devices. The SPI has four signal lines: Master Output Slave Input (MOSI) used for transfer data from the master device to the slave devices, Master Input Slave Output (MISO) used for transfer data from a slave device to the master, Serial Clock (CLK) generated by the master device to synchronize MOSI and MISO data, and Chip Select (CS) produced by the master device to address different slave devices. The MOSI, MISO, CLK and CS signal lines may be provided between the MPU 300 and the unit BM1. The communication links 104 between the adjacent monitoring units BM may be arranged to support bi-directional SPI data transfer between the MPU 300 and the respective unit BM.

Hence, the present disclosure provides a monitoring system in which no individual monitoring unit BM has to withstand the entire stacked voltage of an energy storage system. Instead, each unit BM should withstand only voltage of a cell pack monitored by that unit. Further, communication and control lines are minimized by configuring each monitoring unit chip for communication with its local neighbor rather than with a chip at a distant location.

The foregoing description illustrates and describes aspects of the present invention. Additionally, the disclosure shows and describes only preferred embodiments, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art.

The embodiments described hereinabove are further intended to explain best modes known of practicing the invention and to enable others skilled in the art to utilize the invention in such, or other, embodiments and with the various modifications required by the particular applications or uses of the invention.

Accordingly, the description is not intended to limit the invention to the form disclosed herein. Also, it is intended that the appended claims be construed to include alternative embodiments.

What is claimed is:

1. A system for monitoring an energy storage system composed of multiple cells connected in series, comprising:
a chain of monitors including first and second monitors, the first monitor being configured for monitoring cells in a first group of the cells in the energy storage system to produce first monitored data, and the second monitor being configured for monitoring cells in a second group of the cells in the energy storage system to produce second monitored data for delivery to a controller, the second monitor being further configured for receiving the first monitored data from the first monitor for delivery to the controller,
a first group of switches, each coupled to a different one of the cells in the first group of cells and controlled by a control signal produced by the first monitor to control charging of the cell to which the switch is coupled, and
a second group of switches, each coupled to a different one of the cells in the second group of cells and controlled by a control signal produced by the second monitor to control charging of the cell to which the switch is coupled,
the controller being responsive to monitored data for producing control data identifying at least one of the multiple cells and instructing the chain of monitors to control charging of the identified cell, the control data being transferred over the chain of monitors,
the first monitor being further configured to receive the control data from the second monitor and determine whether the identified cell is one of the cells in the first group of cells,
the second monitor being further configured to receive the control data and determine whether the identified cell is one of the cells in the second group of cells,
the first monitor producing the control signal to control the switch in the first group of cells that is the identified cell, if the identified cell is in the first group of cells, and
the second monitor producing the control signal to control the switch in the second group of cells that is the identified cell, if the identified cell is in the second group of cells.

2. The system of claim 1, wherein each switch is configured to prevent the cell to which it is coupled from being overcharged when the energy storage system is being charged.

3. The system of claim 2, wherein each switch is responsive to the control signal that controls the switch to provide a bypass for charge current around the cell to which the switch is coupled when the energy storage system is being charged.

4. The system of claim 3, wherein each switch includes a transistor controlled to provide a charge current shunt around the cell to which it is coupled.

5. The system of claim 1, wherein the first monitored data represent voltage at each of the cells in the first group of cells, and the second monitored data represent voltage at each of the cells in the second group of cells.

6. The system of claim 5, wherein the first monitored data further represent temperature around each of the cells in the first group of cells, and the second monitored data further represent temperature around each of the cells in the second group of cells.

7. The system of claim 1, wherein the second monitor comprises a register and communication circuit for receiving the first monitored data from the first monitor, transferring the first and the second monitored data to the controller, and for receiving the control data from the controller.

8. The system of claim 7, wherein the register and communication circuit are configured for detecting data relating to the one of the cells in the second group of cells in the control data received from the controller.

9. The system of claim 8, wherein the first and second monitors are adjacent monitors in the chain.

10. The system of claim 9, wherein the chain further comprises a third monitor adjacent the second monitor and configured for monitoring at least a third group of the cells in the energy storage system to produce third monitored data, the third monitor being further configured for receiving the first monitored data from the first monitor via the second monitor, for receiving the second monitored data from the second monitor, and for providing the control data to the second monitor.

11. A method of monitoring cells in an energy storage system composed of multiple cells connected in series, the method comprising the steps of:
monitoring a first group of cells by a first monitor to produce first monitored data, monitoring a second group of cells by a second monitor to produce second monitored data,
transferring the first monitored data from the first monitor to the second monitor for delivery to a controller,
transferring the second monitored data to the controller,
in response to monitored data, producing control data by the controller to control charging of the cells, the control data identifying at least one cell to be controlled,
transferring the control data to the second monitor,
determining by the second monitor whether the control data identify at least one cell in the second group of cells,
if the second monitor determines that the control data identify at least one cell in the second group of cells, producing a second control signal to control charging said at least one cell,
if the second monitor determines that the control data do not identify at least one cell in the second group of cells, transferring the control data from the second monitor to the first monitor,
determining by the first monitor whether the control data identify at least one cell in the first group of cells, and
if the first monitor determines that the control data identify at least one cell in the first group of cells, producing a first control signal to control charging of said at least one cell in the first group of cells.

12. The method of claim 11, wherein the control data transferred to the first monitor are produced in response to the first monitored data.

13. The method of claim 11, wherein the control data transferred to the first monitor controls supplying charge current to said at least one cell in the first group of cells to prevent said at least one cell from being overcharged during charging of the energy storage system.

14. The method of claim 13, wherein the control data transferred to the first monitor cause the charge current to bypass said at least one cell in the first group of cells during charging of the energy storage system.

15. The method of claim 11, wherein the first monitored data indicate voltage at said at least one cell in the first group of cells.

16. The method of claim 15, wherein the first monitored data further indicate temperature in an area of said at least one cell in the first group of cells.

* * * * *